(12) United States Patent
Forrest et al.

(10) Patent No.: US 8,922,113 B2
(45) Date of Patent: Dec. 30, 2014

(54) OLED DEVICE WITH INTEGRATED REFLECTOR

(71) Applicant: The Regents of The University of Michigan, Ann Arbor, MI (US)

(72) Inventors: Stephen R. Forrest, Ann Arbor, MI (US); Michael Slootsky, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days.

(21) Appl. No.: 13/757,213

(22) Filed: Feb. 1, 2013

(65) Prior Publication Data

US 2013/0200781 A1  Aug. 8, 2013

Related U.S. Application Data

(60) Provisional application No. 61/594,676, filed on Feb. 3, 2012.

(51) Int. Cl.
| | |
|---|---|
| *H01L 51/52* | (2006.01) |
| *H01L 51/56* | (2006.01) |
| *H05B 33/22* | (2006.01) |
| *H05B 33/10* | (2006.01) |
| *H05B 33/26* | (2006.01) |

(52) U.S. Cl.
CPC ............... *H05B 33/22* (2013.01); *H05B 33/10* (2013.01); *H05B 33/26* (2013.01); *H01L 51/5271* (2013.01); *H01L 51/5265* (2013.01); *H01L 2251/5338* (2013.01); *H01L 2251/5361* (2013.01)

USPC ............................................. 313/504; 445/24

(58) Field of Classification Search
USPC ............................... 313/498–512; 445/24–25
See application file for complete search history.

(56) References Cited

U.S. PATENT DOCUMENTS

| | | | |
|---|---|---|---|
| 8,227,796 B2* | 7/2012 | Asaki et al. | 257/40 |
| 2004/0135160 A1* | 7/2004 | Cok | 257/88 |
| 2006/0006778 A1* | 1/2006 | Lee et al. | 313/113 |
| 2006/0169989 A1* | 8/2006 | Bhattacharya et al. | 257/79 |
| 2007/0009222 A1* | 1/2007 | Koo et al. | 385/147 |
| 2008/0007936 A1* | 1/2008 | Liu et al. | 362/84 |
| 2009/0185127 A1* | 7/2009 | Tanaka et al. | 349/152 |
| 2012/0098417 A1* | 4/2012 | Inoue et al. | 313/504 |

* cited by examiner

*Primary Examiner* — Donald Raleigh
(74) *Attorney, Agent, or Firm* — Reising Ethington P.C.

(57) ABSTRACT

An OLED device includes an OLED structure having a curved shape and/or a concave surface. The OLED structure may function both as light source and as a reflector configured to concentrate light produced by the structure. An OLED may be formed in the shape of a reflector so that light is provided at the concave surface and so that light is reflected from the concave surface at the same location along the surface. The OLED structure can include a flexible substrate formed to shape, along with an organic layer and electrode layers coated over a substrate surface either before or after the substrate is formed. The OLED structure may also include a microcavity OLED, a grating layer, and/or one or more optical elements that alter the characteristics of the light emitted at an aperture of the structure.

16 Claims, 7 Drawing Sheets

OLED DEVICE WITH INTEGRATED REFLECTOR

CROSS-REFERENCE TO RELATED APPLICATION

This application claims the benefit of U.S. Provisional Application No. 61/594,676, filed Feb. 3, 2012, the entire contents of which are hereby incorporated by reference.

GOVERNMENT LICENSE RIGHTS

This invention was made with government support under FA9550-10-1-0339 awarded by the Air Force Office of Scientific Research (AFOSR). The government has certain rights in the invention.

JOINT RESEARCH AGREEMENT

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

TECHNICAL FIELD

This disclosure is related to organic LEDs (OLEDs) and structures and techniques for concentrating the light produced by an OLED.

BACKGROUND

Organic light emitting diodes offer a potentially low cost and energy efficient source of light. But limitations on the brightness of light produced by OLEDs have limited their applications. While some techniques have been proposed to increase the brightness of OLED sources, the techniques typically reduce OLED efficiency, reduced OLED life, or include other effects that work counter to one or more of the advantages of OLEDs that made them attractive in the first place.

SUMMARY

In accordance with one embodiment, an organic light emitting diode (OLED) device includes an OLED structure having a concave shape at least partially defining an internal cavity and having a light exit aperture. The OLED structure includes electrodes and one or more organic material layers that, in response to electrical power being applied to the electrodes, provide light within the internal cavity that exits the aperture either by direct radiation through the aperture or via one or more reflections off the OLED structure within the cavity.

In accordance with another embodiment, a layered light reflector having a concave shape includes an organic material layer that produces light in response to an applied voltage, and further includes a reflective layer that reflects light away from the concave shape. The organic material layer and the reflective layer at least partly overlap each other so that at least a portion of the reflector emits light and reflects light at the same location along the concave shape.

In accordance with another embodiment, a method of making an OLED light reflector includes the steps of: (a) forming a substrate into a shape having a concave side, a light-emitting end, and an opposite end; and (b) disposing an OLED over a surface of the substrate. The OLED is arranged to provide light at the concave side of the shape when formed, and at least a portion of the OLED is located between the ends of the shape.

DETAILED DESCRIPTION OF THE ILLUSTRATED EMBODIMENT(S)

Figure 1:
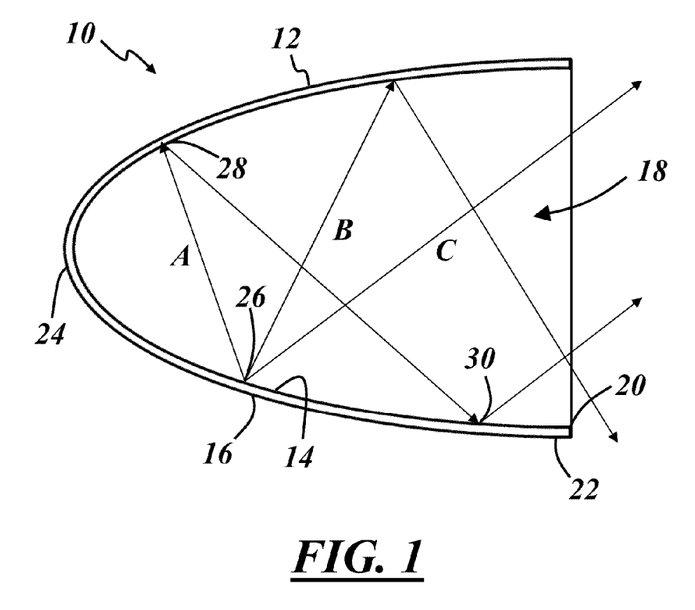
FIG. 1 is a schematic representation of one embodiment of an OLED device having a curved shape.

The present disclosure includes techniques and structures that may be useful to enhance the utility of OLED light sources by concentrating the light produced by OLEDs without necessarily providing additional dedicated light concentrating components. FIG. 1 is a cross-sectional view of an OLED device 10 according to one embodiment. The illustrated device is an OLED structure 12 that is also a light reflector capable of producing light when powered and also capable of concentrating the produced light. Structure 12 has a concave side 14 and an opposite side 16. In this embodiment, the opposite side 16 is convex in shape, but it could be any shape. The shape of concave side 14 at least partly defines an internal cavity 18. Structure 12 also includes a light exit aperture 20 at a light emitting end 22. In this particular embodiment, the opposite end 24 of the structure is closed. The concave side 14 in the illustrated embodiment is a smooth, continuous, curved surface, but the concave side may be constructed so that it has no concave surfaces. Concave side 14 may include a faceted surface, for example, with a plurality of flat surfaces arranged together to form the overall concave shape. Concave side 14 may have an elliptical profile, a parabolic profile, a spherical profile, a conical profile, or a profile including combinations of these and/or other profiles.

The OLED device 10 may be characterized by the light reflector 12 itself providing light at one or more locations where it also reflects light. For example, structure 12 provides light at location 26 directed away from the concave side 14. The light may travel in various directions, three examples of which are shown in FIG. 1 as directions A, B, and C. Light traveling in direction A is reflected off the concave side 14 of the reflector 12 at a different location 28, then again at location 30 before exiting through aperture 20. Light traveling in direction B is reflected once off concave side 14 before exiting aperture 20, and light traveling in direction C exits aperture 20 by direct radiation. Light from other portions of the structure 12 may be reflected off the concave side 14 at location 26, as well. For example, the structure 12 could provide light at location 28 traveling exactly opposite to direction A to be reflected at location 26.

The source of the light in the internal cavity 18 may be an OLED source. In one embodiment the structure 12 includes a flexible OLED that is formed to include concave side 14 and to partly define internal cavity 18. For example, an OLED having one or more organic layers arranged between electrodes may be deposited on or over a flexible substrate (e.g., a polymer film) and subsequently formed into a shape such as that in FIG. 1. The deposited organic layers produce light when a voltage is applied to the electrodes. A top-emitting OLED may be fabricated on a first side of a flat film substrate intended to be the concave side 14 of the formed structure 12, in which case the substrate may be opaque, reflective, absorbent, or transparent to the light produced by the organic layer(s). In another embodiment, a bottom-emitting OLED is fabricated on an opposite second side of the flat film substrate intended to be the convex side 16 of the formed structure 12, in which case the substrate is at least partly transparent to the produced light. Some examples of OLED structures formed from flexible OLEDs will be described in further detail below. Light-producing organic layer(s) may also be deposited on or over a pre-formed substrate and between electrodes, such as a bottom-emitting diode over the convex side of a pre-formed transparent substrate or a top-emitting diode over the concave side of a pre-formed substrate. The side opposite the concave side is not convex in all embodiments—e.g., a parabolic dish shape may be formed in a block of solid material, and an OLED may be fabricated over the dish-shaped surface.

The OLED light source may be a continuous or discontinuous source arranged to provide light at the concave side 14 of the structure 12. In one embodiment, the structure 12 includes one or more continuous organic layers arranged between continuous electrode layers. Depending on the size of the structure 12, the desired ability to control the color of the light emitted at the aperture, and/or other factors, some embodiments include patterned arrays of OLEDs with individual OLEDs being the same or different color(s). Other embodiments may include non-OLED sources that provide light in the internal cavity 18 or at the concave side 14 of the reflector 12. For example, a light source separate from the organic layers of structure 12, such as a conventional LED, a separately powered OLED, and/or some other light source may be placed near end 24 of the reflector of FIG. 1 to provide light at the concave side 14 to supplement the OLED light provided by the reflector itself or to provide an alternative light source for concentration by the reflector. At least a portion of the structure 12 may include a reflective layer arranged to reflect light directed at the concave side 14 of the reflector back away from the concave side of the reflector. Some particular examples of layered structures are described in greater detail below.

Figure 2:
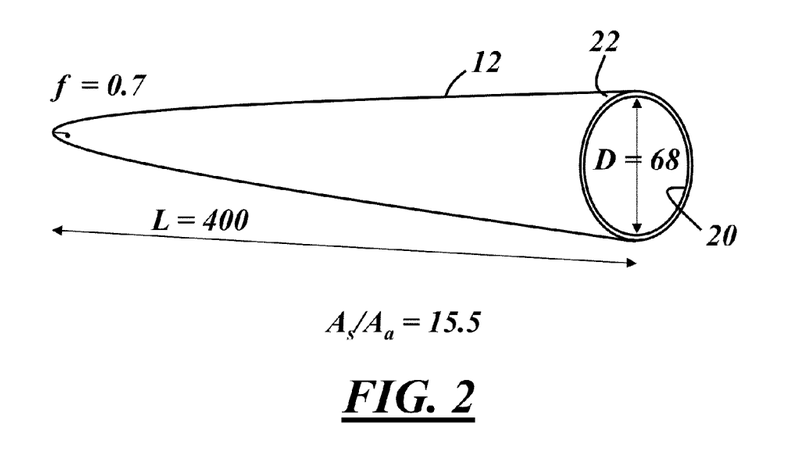
FIG. 2 is a schematic representation of another embodiment of an OLED device having a parabolic curved shape.

A light reflector 12 constructed as described herein may have a light emission profile different from conventional light reflectors. For example, light may be provided by the light reflector 12 nearly anywhere and/or everywhere along its concave side 14 rather than being provided only near some focal point or from an external source. FIGS. 2-6 illustrate some of the characteristics of a parabolic embodiment of the OLED light reflector and of the light provided at the aperture thereof. FIG. 2 illustrates an embodiment that is a parabolic light reflector 12 with an aperture 20 at the light emitting end 22. The illustrated example has an aperture diameter D=68, a length L=400, and a parabolic focal length f=0.7. The focal length is given here only as a characteristic of the shape and is not necessarily significant where the light source is the reflector 12. The dimensions are shown without units for purposes of this description and can be any unit of measurement.

Figure 3:
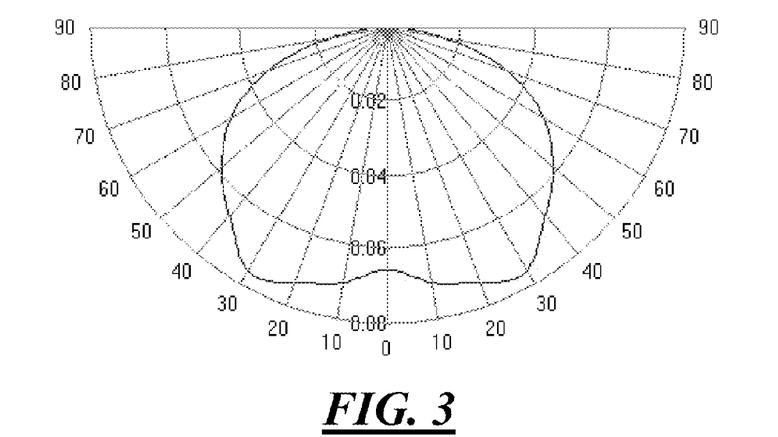
FIG. 3 is a chart of the angular emission profile at the aperture of the OLED device of FIG. 2.
Figure 4:
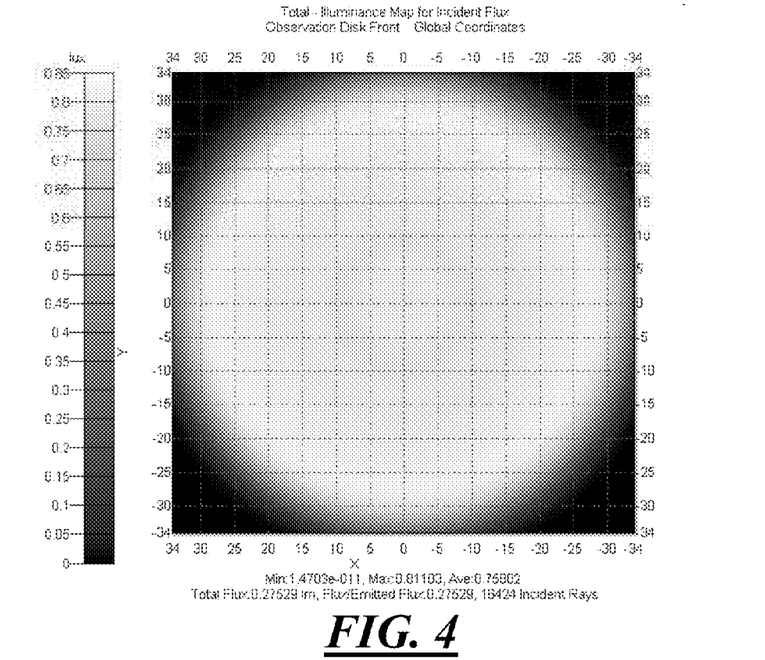
FIG. 4 is a chart of the light intensity distribution at the aperture of the OLED device of FIG. 2.

For purposes of FIGS. 3 and 4, light is provided uniformly at the concave side of the reflector 12 via a layered OLED construction. FIG. 3 is a chart of the angular emission profile of the light provided at the aperture of the reflector illustrated in FIG. 2. Angle is plotted relative to a longitudinal axis of the reflector shape. FIG. 4 is a chart of the light intensity distribution at the aperture of the OLED device of FIG. 2. FIG. 4 demonstrates the relative uniformity of light at the aperture with the reflector shape of FIG. 2.

The light provided at the aperture of the light reflectors described herein may be characterized by a concentration factor and by an extraction coefficient. The concentration factor is generally an indicator of how much the light provided at the aperture is intensified compared to the light provided at the concave side of the reflector. The extraction coefficient is an indicator of what portion of the light provided at the concave side of the reflector becomes available at the aperture. The concentration factor for the light produced by the OLED structure, where light is provided at the concave side of the structure along the entire surface of the internal cavity, is given by the following equation:

$$\text{Concentration Factor} = (A_s/A_a)(\eta_{ext}),$$

where $A_s$ is the surface area of the concave side of the reflector that provides light, $A_a$ is the area at the aperture, and $\eta_{ext}$ is the extraction coefficient. $\eta_{ext}$ depends on structure reflectivity and geometry.

Figure 5:
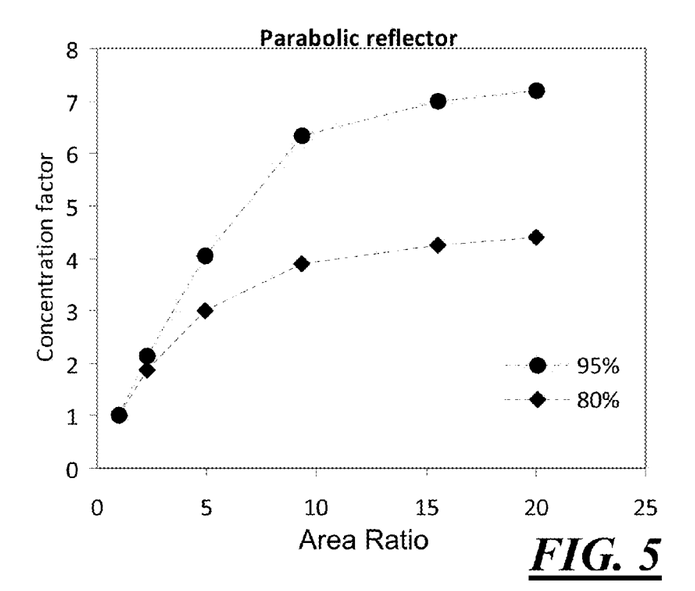
FIG. 5 is a plot of the light concentration factor of a parabolic version of the OLED device, shown as a function of the ratio of reflector surface area to aperture area.
Figure 6:
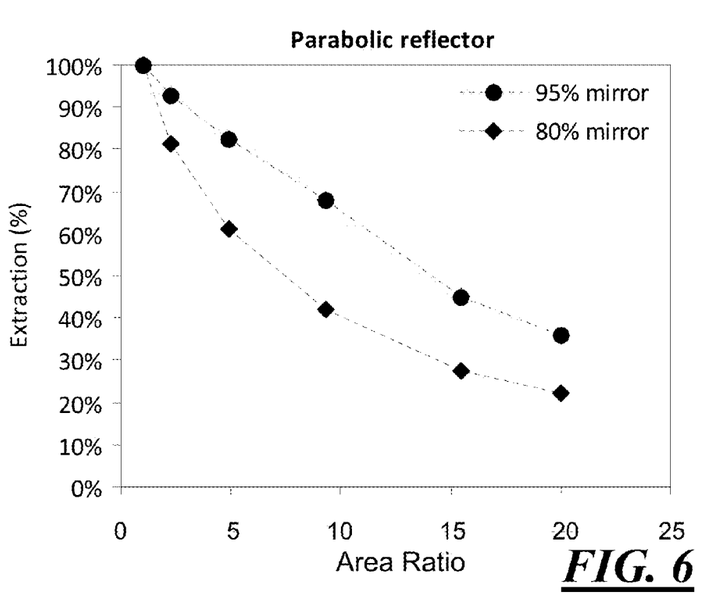
FIG. 6 is a plot of light extraction from a parabolic version of the OLED device, shown as a function of the ratio of reflector surface area to aperture area.

For the shape depicted in FIG. 2, the area ratio $A_s/A_a$ is about 15.5. Both the concentration factor and the extraction coefficient $\eta_{ext}$ depend on this area ratio, $A_s/A_a$, as described with reference to FIGS. 5 and 6. FIG. 5 is a chart showing the concentration factor for a parabolic embodiment of the OLED light reflector, plotted as a function of the area ratio. Two different reflectivity levels for the light reflector are shown in the chart. At 80% reflectivity, the parabolic OLED light reflector concentrates light by a factor of about 4, with reflector geometries having an area ratio in a range from about 10 to about 20. At 95% reflectivity, the concentration factor ranges from 6 to 7 or higher for the same area ratio range. The increased light concentration due to higher reflectivity for the same area ratio is at least partly a result of the increased extraction coefficient. In other words, higher reflectivity at the concave side of the reflector allows more light to find its way out of the aperture rather than being absorbed by the reflector as it is reflected multiple times off of the concave side of the reflector. As shown in FIG. 6, this effect is pronounced for area ratios between 5 and 15. Though these plots are specific to parabolic profiles, other concave shapes can be characterized in a similar fashion with respect to their ability to concentrate light produced by the OLED reflector.

OLED devices constructed as described herein may also include one or more optical element(s) arranged to affect the concentrated light from the light reflector. For example, an optical element may be arranged at or adjacent the aperture of the OLED reflector to modify the angular emission profile of the light at the aperture. The optical element may be or may include a diffuser, a microlens, and/or other types of beam modifying elements to enhance the uniformity of the light at the aperture or to further concentrate the light at the aperture, for example. In one embodiment, the optical element is a microstructured film. The microstructured film may be a microprism film, for example. In another embodiment, the OLED device includes a plurality of optical elements arranged at or adjacent the aperture so that light at the aperture passes through each of the optical elements. In one specific embodiment, the plurality of optical elements includes a plurality of microprism films, and one of the microprism films is oriented orthogonally with respect to at least one of the other microprism films.

Figure 7:
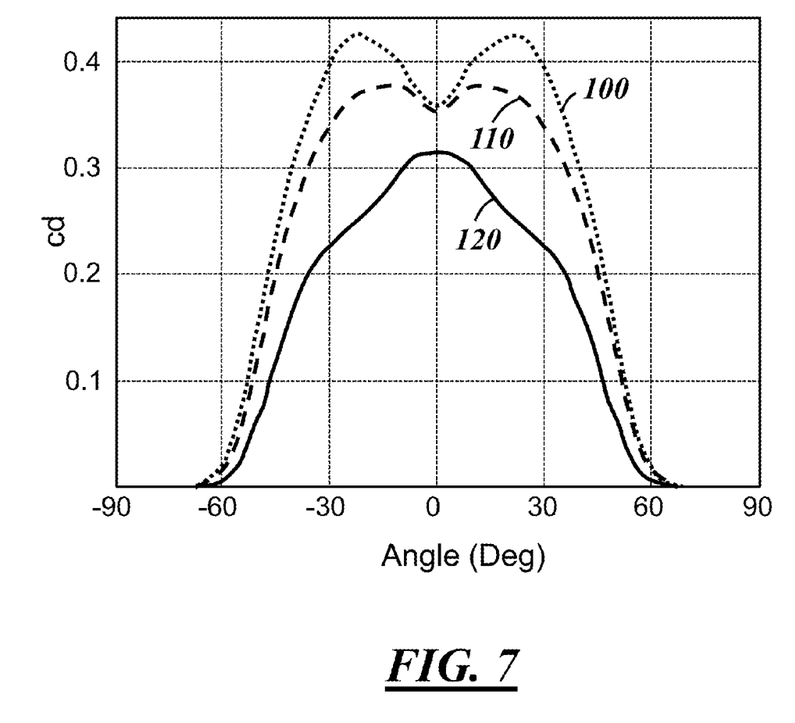
FIG. 7 is a plot of brightness as a function of angle at the aperture of different embodiments of the OLED device: one having an open aperture, one having an optical element at the aperture, and one having a pair of optical elements at the aperture.

FIG. 7 includes plots of light intensity as a function of angle at the aperture of the OLED device according to different embodiments. Plot 100 shows the intensity profile at the open aperture of the OLED device, where the OLED reflector has a concave shape. Plot 110 shows the intensity profile for the OLED device with the same OLED reflector, where the OLED device includes a microprism film at the aperture. The particular microprism film used here makes the intensity profile more uniform than with the open aperture of plot 100, particularly near the center of the distribution. Plot 120 shows the intensity profile for the OLED device from plot 110, but with a second microprism film at the aperture oriented orthogonally with the first. The intensity profile is further modified so that the resulting beam emitted by the device has an intensity distribution with a maxima at the center of the distribution.

As previously described, the light reflector of the OLED device may be a layered structure including a plurality of layers, each of which at least partly overlaps one or more other layers. FIGS. 8-13 illustrate several non-limiting examples of layered structures suitable for use in the OLED device. For context with the above-described OLED light reflectors, concave side 14 is also indicated in FIGS. 8-13 and is understood to represent either the concave side of the reflector or the side of the layered structure that will become the concave side of the reflector after forming.

Figure 8:
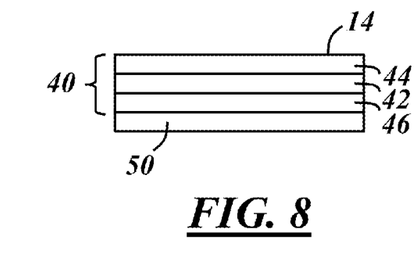
FIG. 8 is a partial side view of one example of a layered structure for use with the OLED device.

The illustrative layered structure of FIG. 8 includes an OLED 40 disposed over a substrate 50. FIG. 8 may be used to describe certain characteristics common to many OLED structures. The OLED 40 includes one or more organic layers 42 arranged between first and second electrodes 44, 46. Materials that may be included as organic layer(s) 42 can be selected from a variety of materials known to skilled artisans. In one embodiment, the OLED 40 includes a single organic layer that produces light when a voltage is applied across the layer. Other embodiments include multiple organic layers, at least one of which produces light when a voltage is applied across the multiple layers. Skilled artisans will also understand that various types of electrode materials may be used to form the OLED electrodes 44, 46. Generally, each electrode is electrically conductive, and at least one electrode is at least partly transparent to allow light produced in the organic layer(s) 42 to pass therethrough. The other electrode may be at least partly transparent as well, or it may be at least partly reflective or absorbent. Different combinations of electrodes and organic layers and other layers may be used with the OLED structures described herein. At least one layer of the OLED structure may be a reflective layer. The reflective layer may include one of the electrode layers 44, 46, some other layer that is not an electrode layer, or both.

With continued reference to FIG. 8, one embodiment includes a top-emitting OLED 40 arranged over the substrate 50. The top-emitting OLED includes a transparent first electrode 44 at the concave side 14 and a reflective second electrode 46 between the substrate 50 and the organic layer(s) 42. Light produced in the organic layer(s) 42 is provided at the concave side 14 by direct radiation from the organic layer(s) and by reflection off of the reflective second electrode 46. Light directed at concave side 14 from other locations is reflected back away from the concave side 14 by the combination of layers, including the reflective second electrode 46. The substrate 50 in this embodiment is preferably opaque (i.e., absorbent and/or reflective), but may be at least partly transparent.

Figure 9:
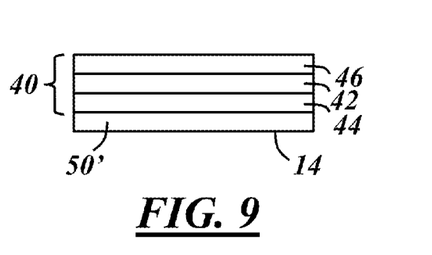
FIG. 9 is a partial side view of another example of a layered structure for use with the OLED device, including a bottom-emitting OLED.

In the embodiment illustrated in FIG. 9, the OLED 40 is a bottom-emitting OLED and is arranged over the substrate 50'. OLED 40 includes the same elements as that shown in FIG. 8, but the arrangement of the electrodes in this embodiment is reversed so that the transparent first electrode 44 is between the substrate 50', and the reflective second electrode 46 is at the side of the structure opposite the concave side 14. In this embodiment, the substrate 50' is at least partly transparent to light produced in the organic layer(s), and may be completely or nearly completely transparent to light at the wavelengths of interest, such as visible light. For example, substrate 50' may be a clear and/or flexible polymer film. Light produced in the organic layer(s) 42 is provided at the concave side 14 by direct radiation from the organic layer(s) and by reflection off of the reflective second electrode 46. Light directed at concave side 14 from other locations is reflected back away from the concave side 14 by the combination of layers, including the reflective second electrode 46.

Figure 10:
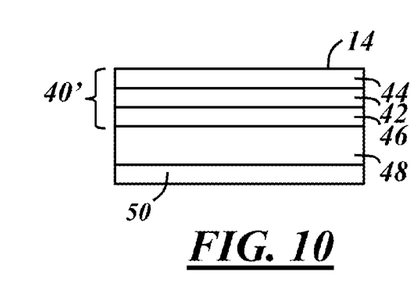
FIG. 10 is a partial side view of another example of a layered structure for use with the OLED device, including a reflective layer.

Referring to FIG. 10, another embodiment includes an OLED 40' in which both of the first and second electrodes 44, 46 are transparent. In this embodiment, a separate or dedicated reflective layer 48 is disposed between the substrate 50 and the OLED 40'. OLED 40' is a top-emitting OLED arranged over the substrate 50. Light produced in the organic layer(s) 42 is provided at the concave side 14 by direct radiation from the organic layer(s) and by reflection off of the reflective layer 48. Light directed at concave side 14 from other locations is reflected back away from the concave side 14 by the combination of layers, including the reflective layer 48. Reflective layer 48 in this embodiment does not have to function as an electrode and can therefore be fabricated to have a different reflectivity than known electrode materials. For example, reflective layer 48 may have a reflectivity up to 95% or higher, while some electrode materials may have lower reflectivity from 80-90% or lower. In one embodiment, the reflective layer 48 is a distributed Bragg reflector (DBR mirror). A similar construction can be utilized with a bottom-emitting diode over a transparent substrate at the concave side of the structure and the reflective layer 48 on the opposite side of the transparent OLED.

Figure 11:
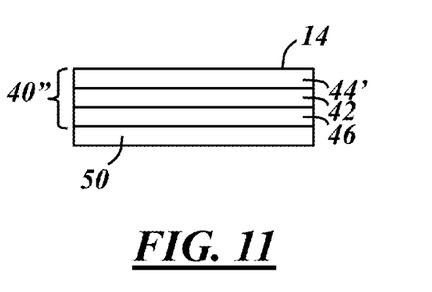
FIG. 11 is a partial side view of another example of a layered structure for use with the OLED device, including a microcavity OLED.

FIG. 11 illustrates another embodiment of a layered OLED structure including a microcavity OLED 40". The microcavity OLED 40" shown in FIG. 11 is similar to the top-emitting OLED of FIG. 10, but includes a semi-transparent first electrode 44' at the concave side 14 rather than a transparent electrode. Semi-transparent electrode 44' is partially reflective so that the light-producing organic layer is located in a Fabry-Perot cavity between the electrodes. In this type of construction, the layer thickness (Fabry-Perot cavity length) affects the angular emission profile of the light from the OLED through the electrode 44'. Thus, the thickness of the organic layer(s) can be selected to achieve the desired angular emission profile. For example, whereas conventional OLED constructions seek to maximize the amount of light emitted by the organic layer(s) in a direction normal to the layer surface (i.e., to maximize apparent OLED brightness), the microcavity OLED 40" of FIG. 11 is constructed to intentionally provide light at the concave side 14 of the OLED structure at various angles other than normal to the layer surfaces. This can have the effect of more evenly distributing the produced light within the internal cavity of the OLED structure and/or distributing the produced light within the internal cavity so that it travels a shorter path to reach the aperture.

For example, with structures having a high area ratio, such as that illustrated in FIG. 2, OLED light distribution at angles other than surface normals can help more light make its way to the aperture by reducing the number of times it is reflected from the concave side of the structure along the way. In other words, in relatively elongated structures, light provided at the concave side of the structure in a direction normal to the layer surfaces must "bounce" back and forth across the structure several times before reaching the aperture, with a portion of the light energy absorbed with each reflection. Light directed at angles away from the surface normal (e.g., more directly toward the light emitting end or the opposite end of the structure) reaches the aperture with a lower number of reflections, and thereby with less energy loss. This construction may also be reversed to arrive at a bottom-emitting OLED over a transparent substrate.

Figure 12:
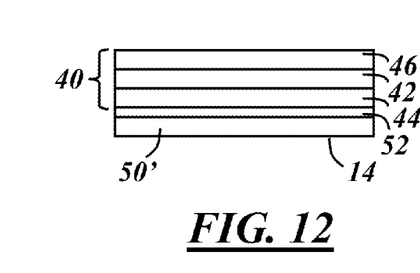
FIG. 12 is a partial side view of another example of a layered structure for use with the OLED device, including a grating layer.
Figure 13:
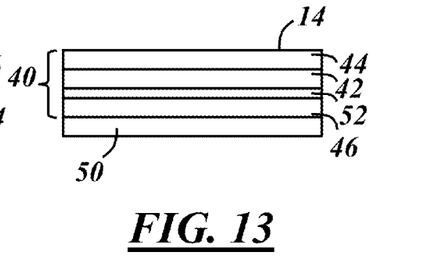
FIG. 13 is a partial side view of another example of a layered structure for use with the OLED device, including a grating layer in a different location.

The embodiments illustrated in FIGS. 12 and 13 each include a grating layer 52 arranged between the reflective layer and the concave side of the structure. In each of these examples, the reflective layer is a reflective electrode, but the reflective layer could alternatively be a separate reflective layer such as layer 48 in FIG. 10. The grating layer is a diffraction layer configured to direct specific wavelengths of light from the organic layer(s) in desired directions away from layer surface normals by diffraction. As with the microcavity OLED, OLED structures including a grating layer can beneficially provide light at the concave side of the structure at angles other than perpendicular to the layer surfaces.

FIG. 12 illustrates one embodiment including a grating layer 52 arranged between the bottom-emitting OLED 40 and the transparent substrate 50' of FIG. 9. In this embodiment, the grating layer 52 is at least partly transparent and changes the angular emission profile of the light that travels through it.

FIG. 13 illustrates another embodiment including a grating layer 52 arranged between the organic layer(s) 42 and the reflective second electrode 46 of FIG. 8. In this embodiment, the grating layer 52 is at least partly reflective and changes the angle of the light that is reflected from it. Other layered OLED structures are possible, including structures with additional layers and/or structures with other combinations of layer functionality, including conductive layers, transparent layers, reflective layers, diffraction layers, organic layers, light-producing layers, stacked OLEDs, etc.

Figure 14:
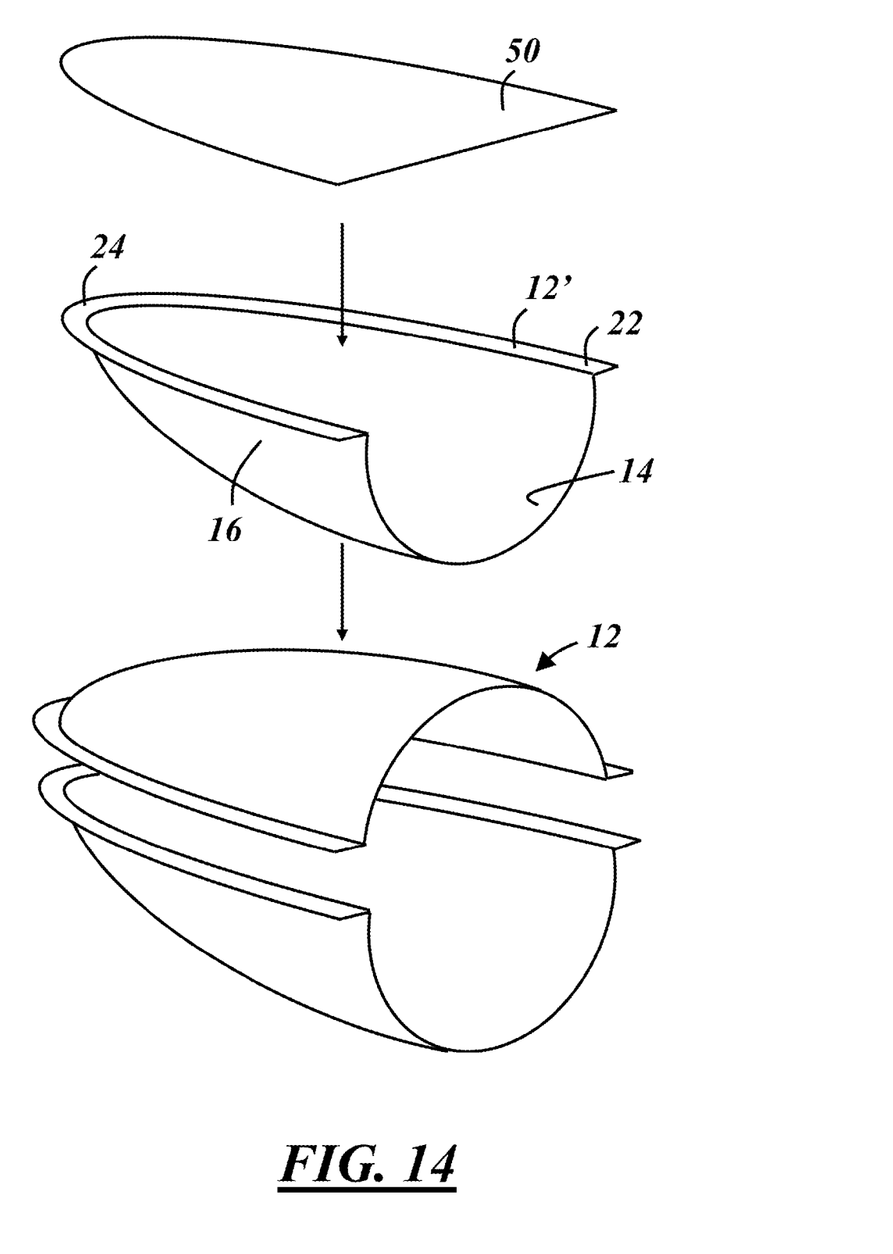
FIG. 14 illustrates a method of making an embodiment of the OLED device.
Figure 15:
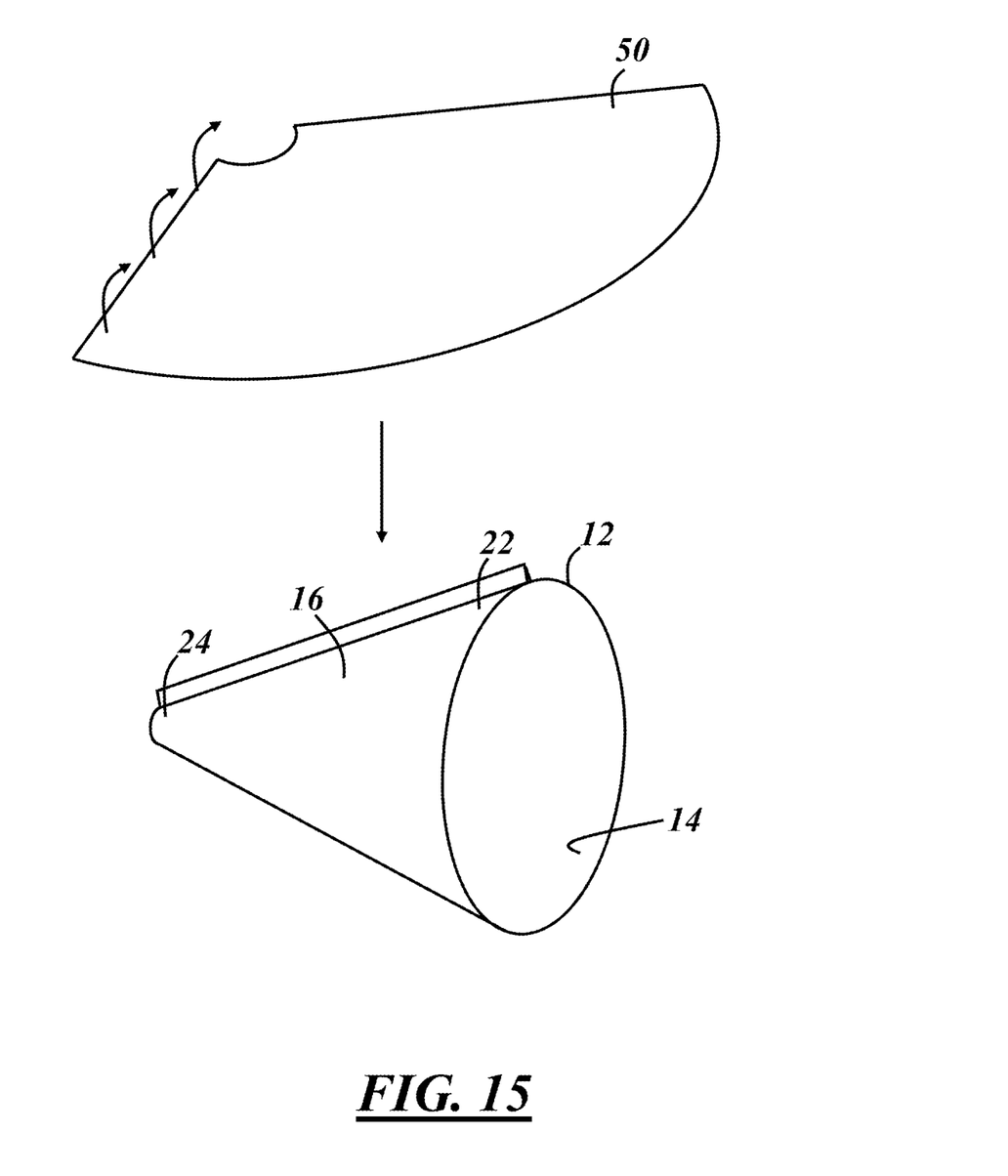
FIG. 15 illustrates a method of making another embodiment of the OLED device.

FIGS. 14 and 15 illustrate examplary methods of making an OLED device having a concave shape. In one embodiment, the method generally includes the steps of: (a) forming a substrate into a shape having a concave side, a light-emitting end, and an opposite end; and (b) disposing an OLED over a surface of the substrate. At least a portion of the OLED is located between the ends of the shape, and the OLED is arranged to provide light at the concave side of the shape when formed. Either of these steps may be performed before the other. More specific examples are described with reference to the figures.

FIG. 14 illustrates a substrate 50 that is formed into a shape 12' including concave side 14, an opposite convex side 16, a light-emitting end 22, and an opposite end 24. The substrate 50 may be part of a flexible OLED having a layered structure deposited over a substrate surface prior to forming, or it may be a substrate over which a layered OLED structure is deposited after forming. OLED deposition may be performed over either of the opposite surfaces of the substrate 50. Forming the shape 12' may include forcing the substrate 50 against a die. For example, in a mechanical forming operation, a first die half may be used to force the substrate into the desired shape against a second die half or cavity. The forming operation may include heating the substrate prior to forming, such as with a thermoforming operation. Additionally or alternatively, the forming operation may include use of a vacuum (i.e., pressure lower than atmospheric pressure) at a die cavity surface to help form the substrate 50 into the desired shape. In one embodiment, vacuum-assisted thermoforming is used. In the particular example shown in FIG. 14, two shapes 12' may be formed and joined at their complimentary edges or flanges as shown to form the OLED structure 12, or a multi-piece substrate that can be used to form the OLED structure 12 by subsequent OLED deposition. Any suitable joining technique may be employed (e.g., fasteners, adhesives, welds, etc.). Similar mechanical deformation techniques may be used in other orientations as well. For example, in the illustrated embodiment, the direction of forming is in the radial direction—i.e. transverse to the longitudinal axis of the finished structure 12. In another embodiment, the direction of forming is in the same direction as the longitudinal axis of the finished structure. In another embodiment, the structure 12 is formed by joining more than two formed substrates. For example, the structure 12 could be formed in thirds or in quarters rather than in halves.

FIG. 15 illustrates another embodiment in which a substrate 50 is rolled into a conical-shaped structure 12, including concave side 14, opposite side 16, light-emitting end 22, and opposite end 24. In this particular example, opposite end 24 of the formed structure 12 includes an opening or aperture that may be subsequently closed off or used as a location for an additional light source. Different portions of the substrate, such as the straight edges of the substrate, may be joined by conventional means as shown.

It is to be understood that the foregoing description and that in the Appendix are of various embodiments of the invention. The invention is not limited to the particular embodiment(s) disclosed herein, but rather is defined solely by the claims below. Furthermore, the statements contained in the foregoing description and Appendix relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. An organic light emitting diode (OLED) device, comprising:
    an OLED structure having a concave shape at least partially defining a hollow internal cavity and having a light exit aperture, wherein the OLED structure includes electrodes and one or more organic material layers on a substrate that, in response to electrical power being applied to the electrodes, provide light within the internal cavity that exits the aperture either by direct radiation through the aperture or via one or more reflections off the OLED structure within the cavity,
    wherein the OLED structure comprises a bottom-emitting OLED located at an exterior surface of the substrate.

2. An OLED device as defined in claim 1, wherein the OLED structure comprises a microcavity OLED.

3. An OLED device as defined in claim 1, wherein at least one electrode comprises a reflective surface.

4. An OLED device as defined in claim 1, further comprising a light-modifying optical element mounted at or adjacent the aperture, said optical element comprising a diffuser, a micro-structured film, a microprism, a microlens, or any combination thereof.

5. An OLED device as defined in claim 4, further comprising a second light-modifying optical element mounted at or adjacent the aperture such that the light emitted by the OLED structure passes sequentially through both optical elements.

6. A layered light reflector, comprising:
    a light-emitting end, an opposite end, and a concave shape between the two ends, the concave shape having a characteristic geometric focal point located between the light-emitting end and the opposite end;
    an organic material layer that produces light in response to an applied voltage; and
    a reflective layer that reflects light away from a concave side of the concave shape, the organic material layer and the reflective layer at least partly overlapping each other so that at least a portion of the light reflector emits light and reflects light in the same direction at the same location along the concave side of the concave shape.

7. A layered light reflector as defined in claim 6, further comprising electrode layers on opposite sides of the organic layer, wherein one of the electrode layers is the reflective layer.

8. A layered light reflector as defined in claim 6, wherein the reflective layer is not an electrode layer.

9. A layered light reflector as defined in claim 6, further comprising a grating layer arranged so that at least some of the light produced by the organic layer passes through the grating layer before being emitted by the reflector.

10. A layered light reflector as defined in claim 6, further comprising a microcavity OLED.

11. An OLED device comprising the layered light reflector as defined in claim 6, wherein the concave shape at least partly defines a light exit aperture and the device further comprises an optical element mounted at or adjacent the aperture, and wherein the optical element includes a diffuser, a micro-structured film, or both a diffuser and a micro-structured film.

12. A method comprising the steps of:
    constructing a plurality of OLED light reflectors according to a method comprising the steps of:
        (a) forming a substrate into a shape having a concave side, a light-emitting end, and an opposite end; and
        (b) disposing an OLED over a surface of the substrate, the OLED being arranged to provide light at the concave side of the shape when formed, and at least a portion of the OLED being located between the ends of the shape; and
    joining the plurality of OLED light reflectors together with the respective concave sides facing toward one another.

13. The method of claim 12, wherein step (a) is performed before step (b).

14. The method of claim 12, wherein step (b) comprises producing a generally flat and flexible OLED, and step (a) is performed after step (b).

15. The method of claim 12, wherein step (a) comprises forming the substrate against a die surface.

16. The method of claim 12, wherein step (a) comprises thermoforming, vacuum forming, or both.

* * * * *